United States Patent [19]

Inoue et al.

[11] Patent Number: 5,473,190
[45] Date of Patent: Dec. 5, 1995

[54] TAB TAPE

[75] Inventors: Shuji Inoue; Yasuhiko Hiraki; Mutsumi Agawa, all of Ibaragi, Japan

[73] Assignee: Intel Corporation, Santa Clara, Calif.

[21] Appl. No.: 167,531

[22] Filed: Dec. 14, 1993

[51] Int. Cl.[6] .................................................. H01L 23/48
[52] U.S. Cl. ........................ 257/671; 257/668; 257/691
[58] Field of Search ................................. 257/671, 668, 257/666, 691

[56] References Cited

U.S. PATENT DOCUMENTS

| | | | |
|---|---|---|---|
| 4,870,476 | 9/1989 | Solstad | 257/671 |
| 4,901,136 | 2/1990 | Neugebauer et al. | 257/668 |
| 5,021,866 | 6/1991 | Sudo et al. | 357/70 |
| 5,049,974 | 9/1991 | Nelson et al. | 257/668 |
| 5,067,004 | 11/1991 | Marshall et al. | 257/668 |
| 5,183,711 | 2/1993 | Wada et al. | 257/668 |
| 5,252,853 | 10/1993 | Michii | 257/668 |
| 5,311,056 | 5/1994 | Wakabayashi et al. | 257/666 |
| 5,325,268 | 6/1994 | Nachnani et al. | 257/666 |
| 5,331,201 | 7/1994 | Nishino | 257/666 |
| 5,349,238 | 9/1994 | Ohsawa et al. | 257/666 |

*Primary Examiner*—Patrick J. Ryan
*Assistant Examiner*—Cathy K. Lee
*Attorney, Agent, or Firm*—Blakely, Sokoloff, Taylor & Zafman

[57] ABSTRACT

A TAB tape is constituted by a base material consisting of, e.g., a polyimide, in which leads composed of a copper foil are formed on the base material, and a power supply unit and a signal unit formed on a substrate, such as a printed circuit board, are connected to electrodes formed on a chip via the copper foil leads. Power supply leads for supplying power to the chip, ground leads for grounding, and signal leads for exchanging signals with the chip are formed by the copper foil on one surface of the base material. A common power supply lead to be connected to the power supply leads and a common ground lead to be connected to the ground leads are formed by the copper foil on the other surface of the base material.

21 Claims, 5 Drawing Sheets

TAB TAPE

BACKGROUND OF THE INVENTION

The present invention relates to a tape for TAB (Tape Automated Bonding) by which leads are formed by photolithography and the ends of these leads are bonded to corresponding bumps of a chip.

As an optimal method for integrating and mounting LSIs at a high density, a method called TAB (Tape Automated Bonding) in which all pads on a chip are bonded to terminals on a package at one time by using metal leads is used recently. In this method, leads are formed by photolithography for each frame of a film-like tape made of a polyimide film, and the ends of these leads are bonded to bumps formed on corresponding electrodes of a chip.

FIG. 10 is a perspective view schematically showing a bonding state between a chip and leads connected by this TAB method. Referring to FIG. 10, reference numeral 1 denotes a chip; 2, leads; and 3, outer leads as the terminal ends of the leads.

First, a formation region for the chip 1 is opened in a TAB tape which is made of a polyimide film, and on the upper surface of which an adhesive is coated. A copper foil or film is pasted on the upper surface of this TAB tape. A resist pattern corresponding to the shape of the leads 2 is formed on this copper foil by using the technique of photography. Thereafter, unnecessary portions of the copper foil are removed by using the resist pattern as a mask. The ends of the leads 2 are bonded in a one-to-one correspondence with a signal electrode SIG, a power supply electrode VCC, and a ground electrode VSS. Note that the outer leads 3 formed on the terminal ends of the leads 2 are connected to a substrate, such as a printed circuit board, or to inner leads of a lead frame through a process of, e.g., bonding.

Conventionally, however, the leads 2 are connected in a one-to-one correspondence with the electrodes of the chip 1. Therefore, if the degree of integration of the chip 1 is increased to increase the number of electrodes of the chip 1, the number of leads 2 also increases accordingly. This makes it very difficult to connect the leads to a substrate or a lead frame.

SUMMARY OF THE INVENTION

It is, therefore, an object of the present invention to provide a TAB tape capable of easily connecting leads to a substrate even if the number of electrodes of a chip is increased.

To achieve the above object of the present invention, there is provided a TAB tape which is constituted by a base material consisting of, e.g., a polyimide, and in which leads composed of a copper foil are formed on the base material, and a power supply unit and a signal unit formed on a substrate, such as a printed circuit board, are connected to electrodes formed on a chip via the copper foil leads, wherein power supply leads for supplying power to the chip, ground leads for grounding, and signal leads for exchanging signals with the chip are formed by the copper foil on one surface of the base material, and a common power supply lead to be connected to the power supply leads and a common ground lead to be connected to the ground leads are formed by the copper foil on the other surface of the base material.

In the above TAB tape, a common signal lead to be connected to the signal leads is formed by the copper foil on the other surface of the base material.

In the above TAB tape, it is also possible to connect the power supply unit on the substrate with the common power supply lead by an electrically conductive adhesive. In addition, the signal unit, the power supply unit, and the ground unit on the substrate are connected through the leads by bonding.

In the above TAB tape, a radiating plate consisting of a metal is connected to the common ground lead.

In the above TAB tape, the other end of the metal radiating plate, one end of which is connected to the common power supply lead, is connected to the chip by an electrically and thermally conductive adhesive.

According to the TAB tape of the present invention, power supply leads and ground leads for supplying power to a chip and signal leads for exchanging signals with the chip are formed on one surface of a base material composed of a polyimide or the like, and a common power supply lead to be connected to the power supply leads and a common ground lead to be connected to the ground leads are formed on the other surface of the base material. Consequently, the power supply leads and the ground leads to be connected to power supply electrodes and ground electrodes of the chip can be extracted through through holes as common leads, which are smaller in number than the power supply leads and the ground leads, from the common power supply lead and the common ground lead. Therefore, the number of leads to be connected to an external component such as a substrate can be decreased.

In addition, a common signal lead to be connected to the signal leads is formed by a copper foil on the other surface of the base material. This makes it possible to connect to an external component by fewer leads than the signal leads connected to individual signal electrodes of the chip.

A power supply unit on a substrate is connected to the common power supply lead by using an electrically conductive adhesive, and a signal unit on the substrate is connected to the signal leads by bonding. Therefore, the power supply and ground lines can be connected by the shortest distance, and this improves the electrical characteristics of a circuit including the chip.

Also, since a radiating plate made of a metal is connected to the common ground lead, heat generated by the individual leads upon high-speed operations of the chip can be diffused effectively.

Furthermore, the other end of the metal radiating plate, one end of which is connected to the common ground lead, is connected to the chip by using an electrically and thermally conductive adhesive. This makes it possible to diffuse heat generated by the individual leads and also decrease the impedance of a circuit including the chip, thereby reducing noise derived from high-speed switching operations of the chip.

DESCRIPTION OF THE PREFERRED EMBODIMENTS

The present invention will be described in detail below with reference to the accompanying drawings.

Figure 9:
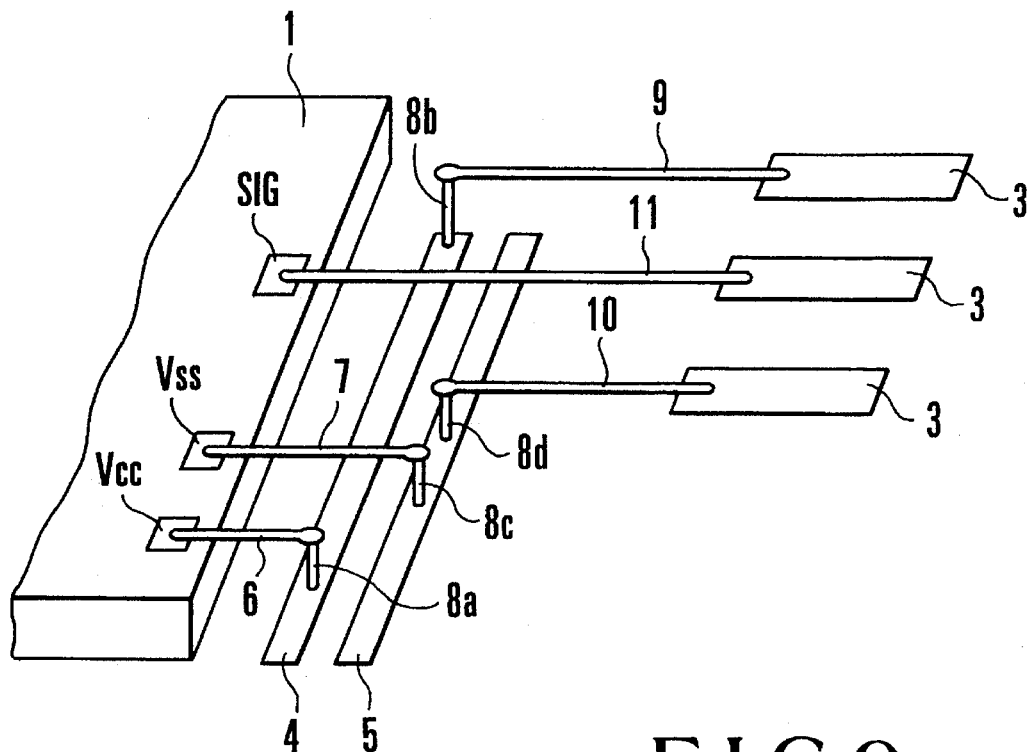
FIG. 9 is a perspective view schematically showing the arrangement of the TAB tape according to the present invention.
Figure 10:
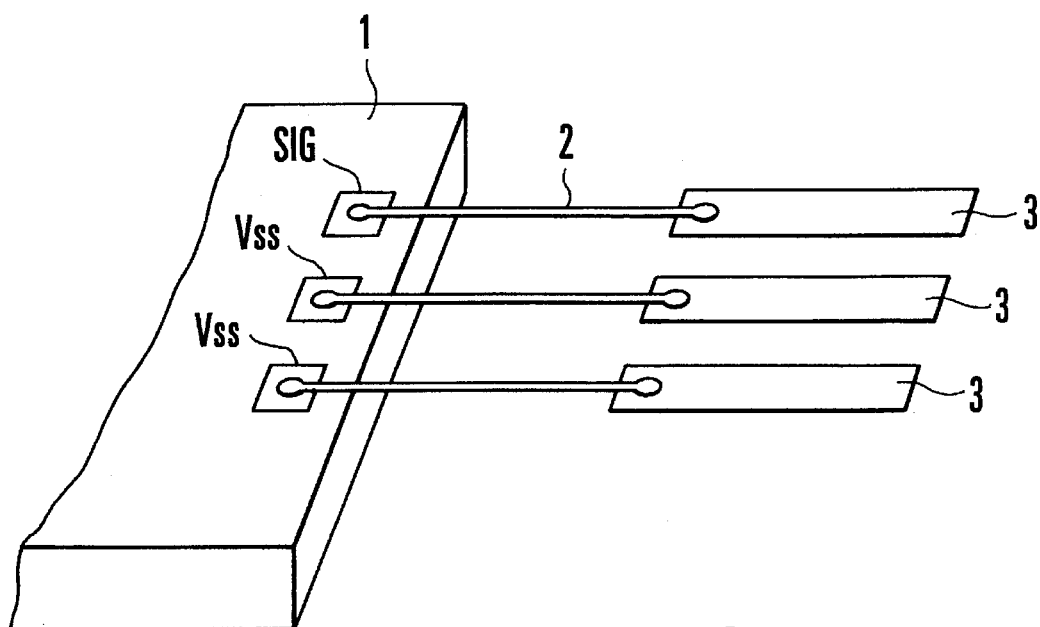
FIG. 10 is a perspective view schematically showing the arrangement of a conventional TAB tape.

FIG. 9 is a perspective view schematically showing a bonding state between leads formed on a TAB tape according to the present invention and a chip 1. Referring to FIG. 9, a common power supply lead 4 and a common ground lead 5, each consisting of a copper foil, are formed on the lower surface of a tape base material composed of a polyimide film (to be described later). In addition, power supply leads 6 and 9 and ground leads 7 and 10 for supplying power to the chip 1, and a signal lead 11 for exchanging signals with the chip 1 are formed by using a copper foil on the upper surface of the tape base material.

The power supply lead 6 connected to a power supply electrode VCC of the chip 1 is connected to the common power supply lead 4 through a connecting conductive portion 8a provided in a through hole. The common power supply lead 4 is connected to the power supply lead 9, as an outer lead, through a connecting conductive portion 8b in another through hole. The ground lead 7 connected to a ground electrode VSS of the chip 1 is connected to the common ground lead 5 through a connecting conductive portion 8c in still another through hole. The common ground lead 5 is connected to the ground lead 10 through a connecting conductive portion 8d in still another through hole. Note that the signal lead 11 connected to a signal electrode SIG of the chip 1 is connected as an outer lead directly to an external substrate or the like without being connected to any common lead.

Figure 1:
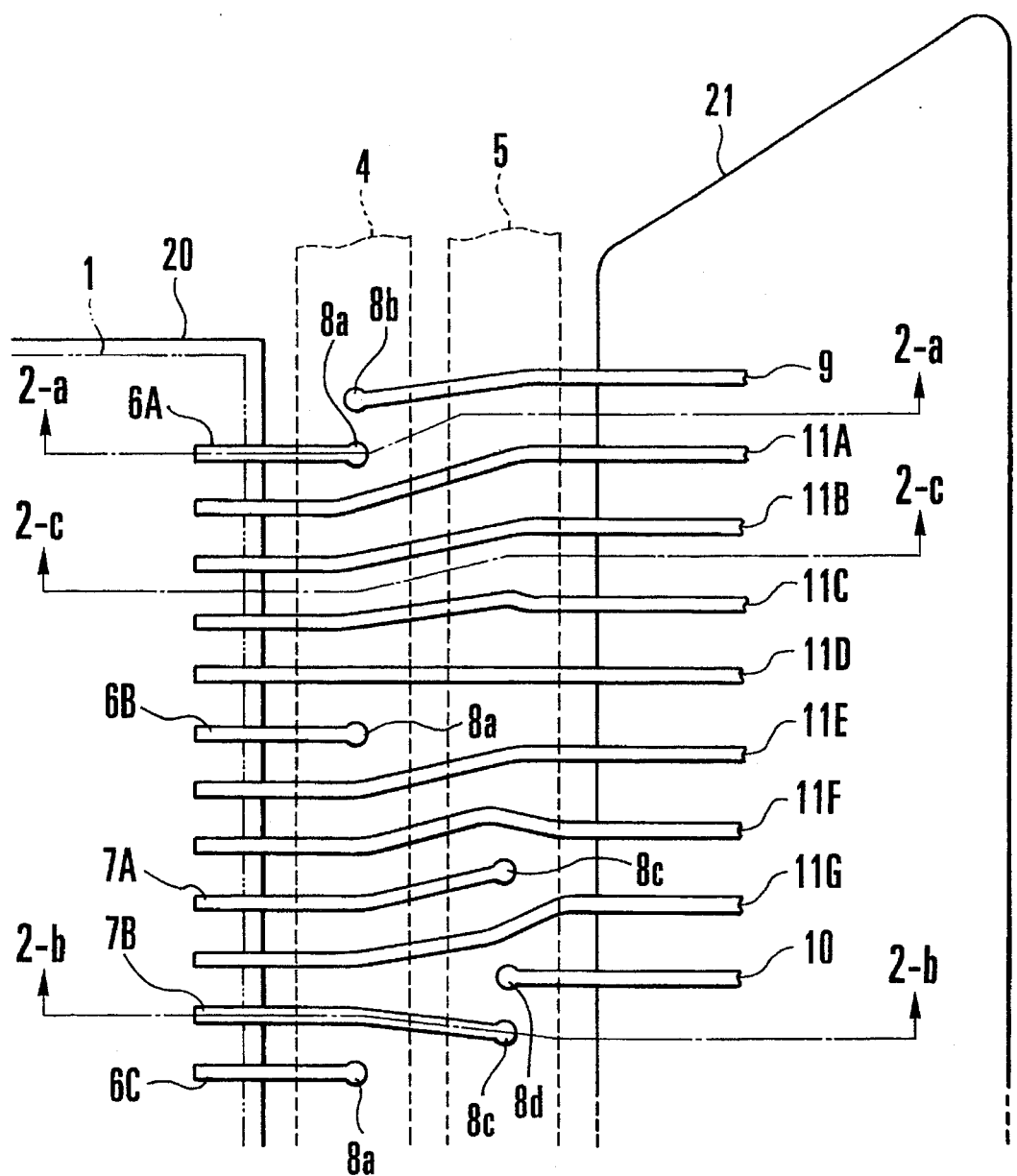
FIG. 1 is a plan view showing one embodiment of a TAB tape according to the present invention.

FIG. 1 is a plan view showing one embodiment of the TAB tape according to the present invention. Referring to FIG. 1, reference numerals 6A to 6C denote power supply leads for connecting power supply electrodes of a chip 1 through connecting conductive portions 8a with the above-mentioned common power supply lead 4 formed on the lower surface of a polyimide tape base material; 7A and 7B, ground leads for connecting ground electrodes of the chip 1 through connecting conductive portions 8c with the above-mentioned common ground lead 5 formed on the lower surface of the polyimide tape base material; 9 and 10, a power supply outer lead and a ground outer lead, respectively, as the outer leads described above, one ends of which are connected to the common power supply lead 4 and the common ground lead 5 through the connecting conductive portions 8b and 8c, respectively; and 11A to 11G, signal leads such as the one mentioned earlier. All of these leads are formed on the upper surface of the polyimide tape base material as described above. Note that reference numeral 20 denotes a chip hole formed in this polyimide tape base material; and 21, an outer lead hole which is also formed in the polyimide tape base material.

When a plurality of power supply electrodes and ground electrodes are formed on the chip 1 as shown in FIG. 1, these electrodes are connected to the common power supply lead 4 and the common ground lead 5 by their respective power supply leads 6A to 6C and ground leads 7A and 7B through the connecting conductive portions 8a and 8b. From the common power supply lead 4 and the common ground lead 5 to which these electrodes are connected, these electrodes can be extracted as the single power supply outer lead 9 and the single ground outer lead 10 and connected to an external component.

Consequently, it is possible to connect a chip 1 to an external component by using a small number of outer leads even if the number of electrodes of the chip 1 is increased. For example, in the embodiment shown in FIG. 1, while the number of power supply electrodes and the ground electrodes is five in total, the number of outer leads is two; i.e., the number of outer leads can be reduced.

In the embodiment shown in FIG. 1, the signal leads 11A to 11G are separately extracted as outer leads from the chip 1. If, however, a common signal lead is formed on the lower surface of the polyimide tape base material, signal leads that can be connected together to the chip 1 can be extracted as one outer lead by connecting them to this common signal lead. Consequently, the number of leads to be connected to an external component can be further decreased, and this makes it possible to give sufficient margins to spacings between the leads. This improves workability in connecting the leads to a substrate or the like, greatly reducing the assembly cost.

Figure 2A:
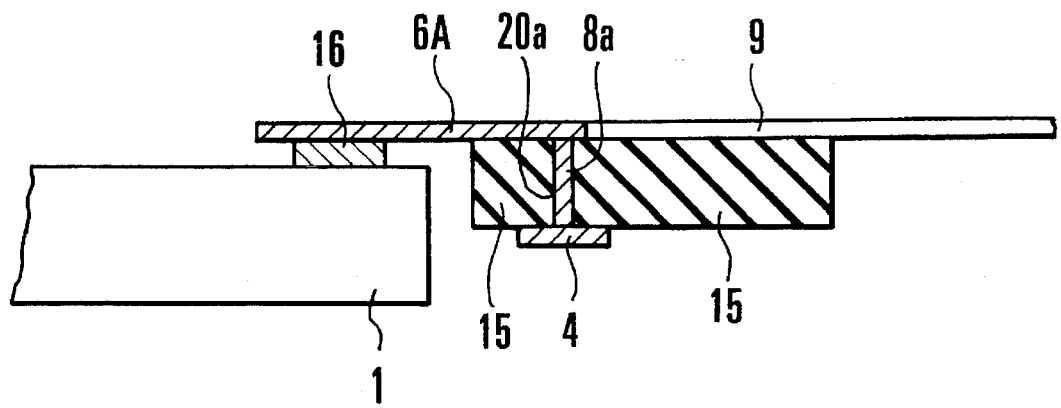
FIGS. 2A to 2C are sectional views showing the TAB tape shown in FIG. 1.
Figure 2B:
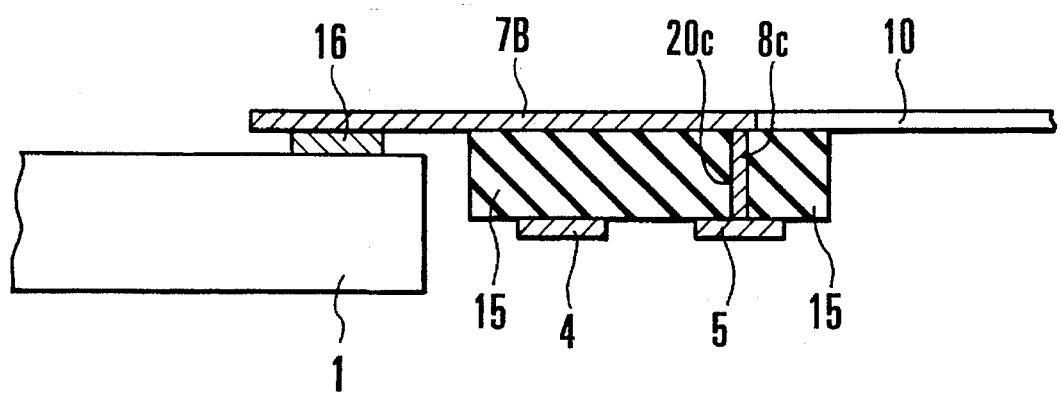
Figure 2C:
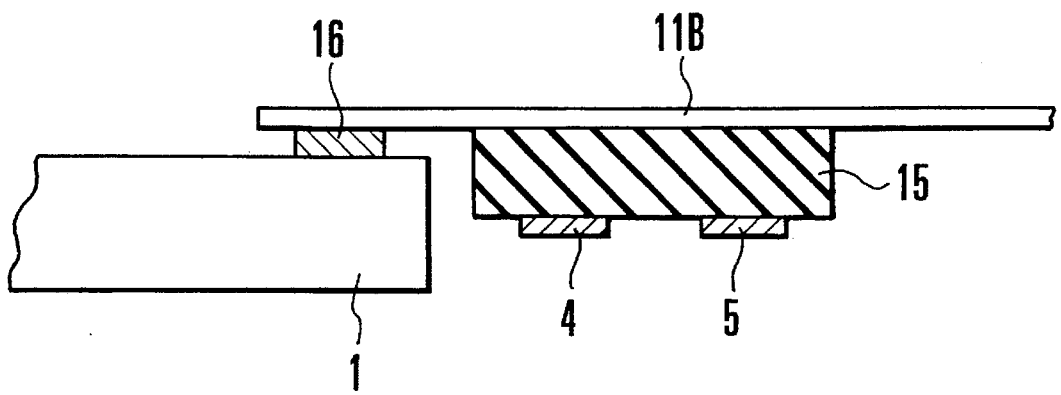

FIGS. 2A to 2C are sectional views showing the TAB tape illustrated in FIG. 1.

More specifically, FIGS. 2A, 2B, and 2C are sectional views taken along lines II-a—II-a, II-b—II-b, and II-c—II-c of FIG. 1, respectively.

Referring to FIG. 2A, a bump 16 formed on the power supply electrode of the chip 1 is connected to the power supply lead 6A, and the power supply lead 6A is connected to the common power supply lead 4 through one through hole 8 formed in a polyimide tape base material 15. The common power supply lead 4 is connected to the power supply outer lead 9 through the connecting conductive portion 8a in a through hole 20a formed in another portion of the polyimide tape base material 15.

Referring to FIG. 2B, a bump 16 formed on the ground electrode of the chip 1 is connected to the ground lead 7B, and the ground lead 7B is connected to the common ground lead 5 through the connecting portion 8c in a through hole 20c formed in the polyimide tape base material 15. The common ground lead 5 is connected to the ground lead 10 as an outer lead through the connecting portion 8d in another through hole formed in another portion of the polyimide tape base material 15.

Referring to FIG. 2C, a bump 16 formed on the signal electrode of the chip 1 is connected to the signal lead 11B, and the signal lead 11B is directly extracted as an outer lead without being connected to any common lead.

Figure 3:
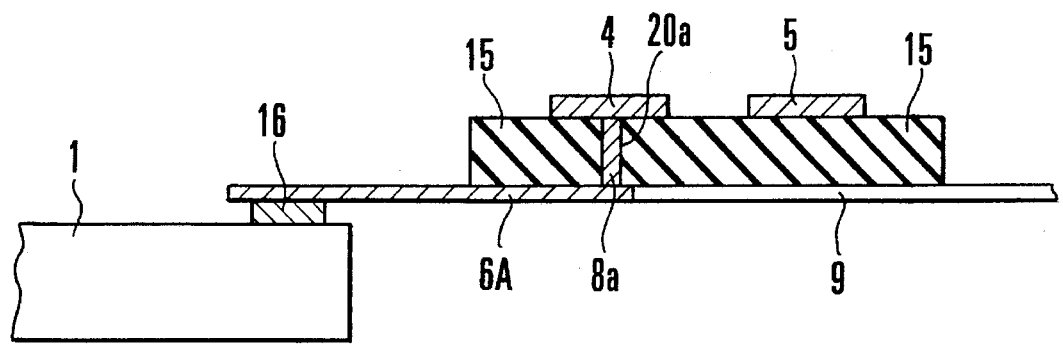
FIG. 3 is a sectional view showing the second embodiment of the TAB tape according to the present invention.

FIG. 3 is a sectional view showing the second embodiment of the present invention, in which the arrangement of leads formed on the upper and lower surfaces of a polyimide tape base material 15 is vertically opposite to the arrangement illustrated in FIG. 2A. That is, a common power supply lead 4 and a common ground lead 5 are formed on the upper surface of the polyimide tape base material 15, and power supply leads, ground leads, and signal leads are formed on the lower surface of the base material 15. In this manner, it is possible to freely form the individual leads on the upper and lower surfaces of the polyimide tape base material 15.

In addition, it is also possible to form a common signal lead corresponding to signal leads 11 for transmitting various signals from the chip 1 in the same manner as for the common power supply lead 4 and the common ground lead 5. A circuit consisting of an inductor element and a capacitor element can also be formed additionally by using a paint or the like with respect to this common signal lead.

Figure 4:
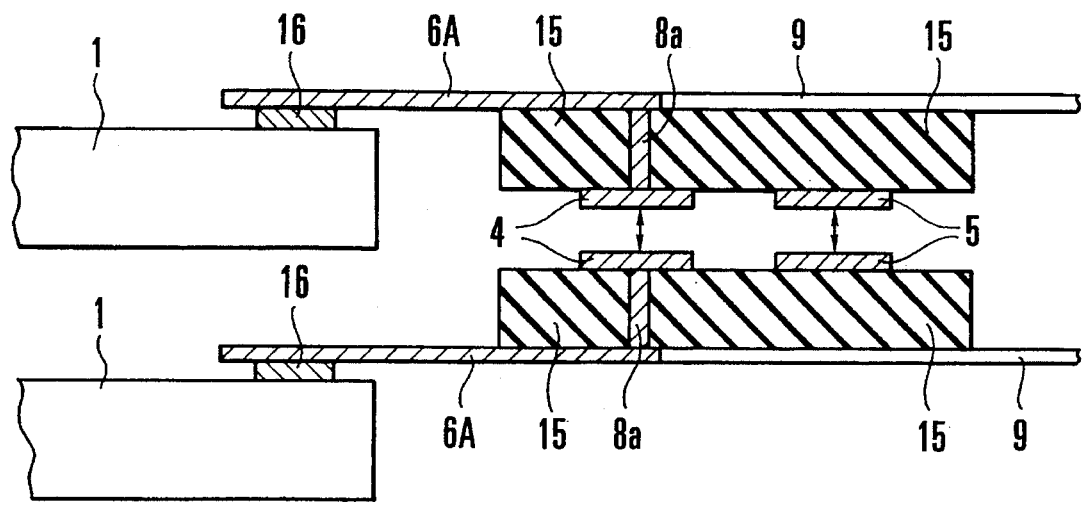
FIG. 4 is a sectional view showing the third embodiment of the TAB tape according to the present invention.

FIG. 4 is a sectional view showing the third embodiment of the present invention, in which the common power supply lead 4 and the common ground lead 5 of the TAB tape illustrated in FIG. 2 are connected to those of the TAB tape illustrated in FIG. 3 by using, e.g., an electrically conductive adhesive.

This layered structure of the TAB tapes allows the individual TAP tapes to share their common power supply leads 4 and common ground leads 5, making it possible to further decrease the number of leads to be connected to an external substrate, such as a printed circuit board. In addition, the electrical characteristics improve because both the common power supply leads and the common ground leads are connected by the shortest distance. Furthermore, since the signal leads of the individual TAB tapes also can be connected through, e.g., through holes, the number of outer leads can be further reduced, and the degree of integration of the TAB tapes can be improved.

Figure 5:
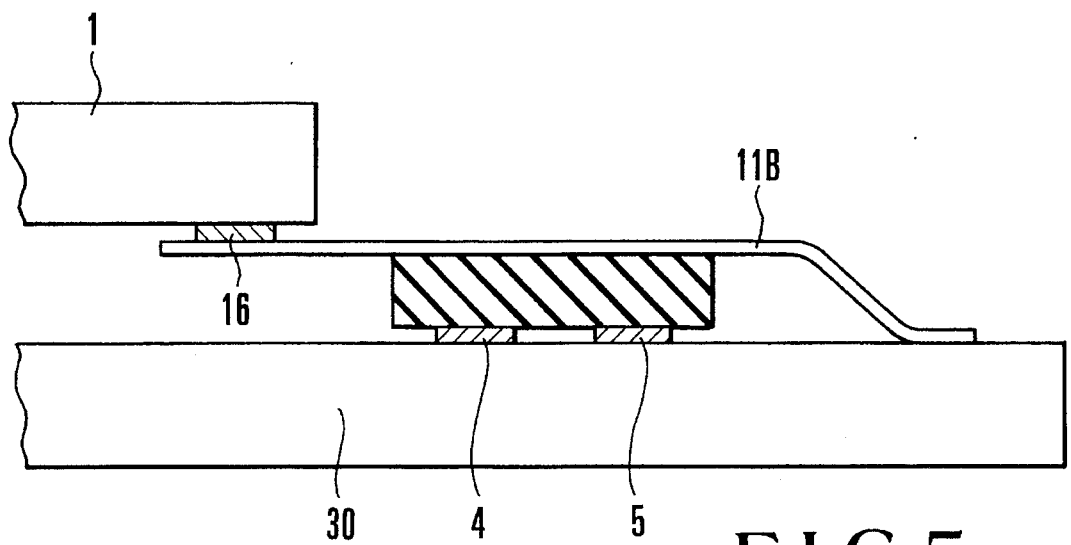
FIG. 5 is a sectional view showing the fourth embodiment of the TAB tape according to the present invention.

FIG. 5 is a sectional view showing the fourth embodiment of the present invention, in which a connection state of each lead of a TAB tape to a substrate 30 is illustrated.

Referring to FIG. 5, a common power supply lead 4 and a common ground lead 5 formed on a polyimide tape base material are connected to a ground line and a power supply line (not shown), respectively, formed on a substrate 30 by using an electrically conductive adhesive or the like. In addition, a signal lead 11B is connected to a signal terminal (not shown) on the substrate 30 by bonding.

Connecting the TAB tape with the substrate 30 as described above makes it possible to connect particularly the ground components and the power supply components by the shortest distance. Therefore, since the impedance of each common lead can be decreased, switching noise resulting from high-speed switching operations of the chip 1 can be reduced. This consequently improves the electrical characteristics of the overall circuit including the chip 1.

Figure 6:
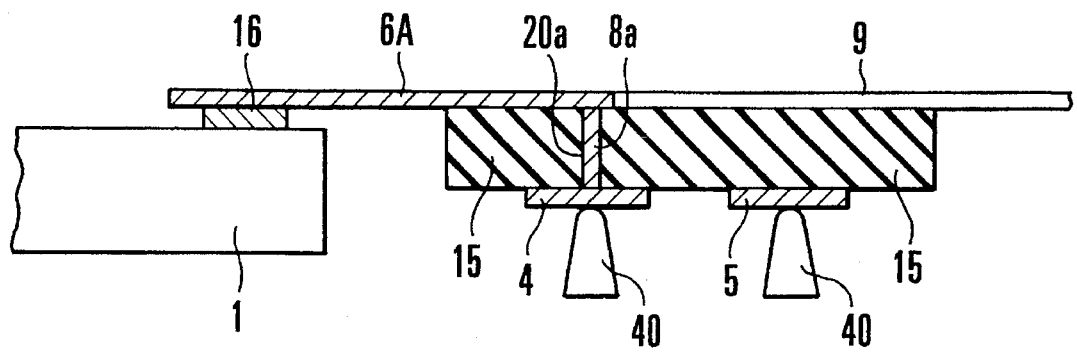
FIG. 6 is a sectional view showing the state of electrical tests for leads formed on the TAB tape according to the present invention.

FIG. 6 is a view showing a check state of each lead of a TAB tape. Referring to FIG. 6, a common power supply lead 4 and a common ground lead 5 are formed on one surface (in FIG. 6, the lower surface) of a polyimide tape base material 15. This facilitates tests concerning a power supply of a chip 1 when a probe 40 is used to carry out the tests. In addition, since the number of outer leads is decreased, spacings between the outer leads increase, and this makes signal tests for the chip 1 easier to perform.

Figure 7:
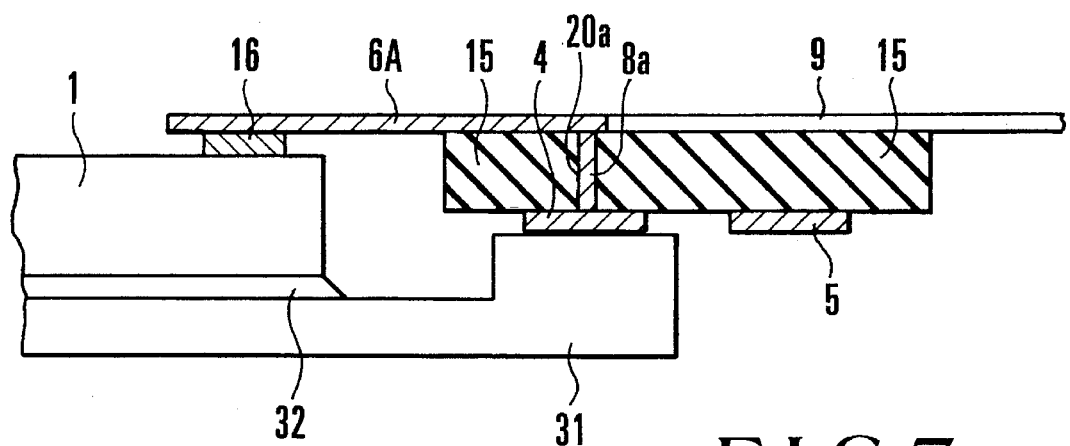
FIG. 7 is a sectional view showing the fifth embodiment of the TAB tape according to the present invention.

FIG. 7 is a sectional view showing the fifth embodiment of the present invention, which illustrates an example of radiation of heat from individual leads of a TAB tape when power is supplied to these leads.

That is, a common power supply lead 4 formed on a polyimide tape base material 15 is brought into contact with the upper surface of one side of a radiating plate (heat sink) 31 consisting of a metal. The upper surface of the other side of the radiating plate 31 is adhered to the surface (bottom surface) of a chip 1 different from its electrode formation surface by using an electrically and thermally conductive adhesive 32 such as a grease.

With this arrangement, it is possible to diffuse a large quantity of heat which is generated from individual leads due to high-speed operations of the chip 1 in recent years. In addition, since the impedance of each power supply lead can be decreased, noise produced by high-speed switching operations of the chip 1 can be reduced.

Figure 8:
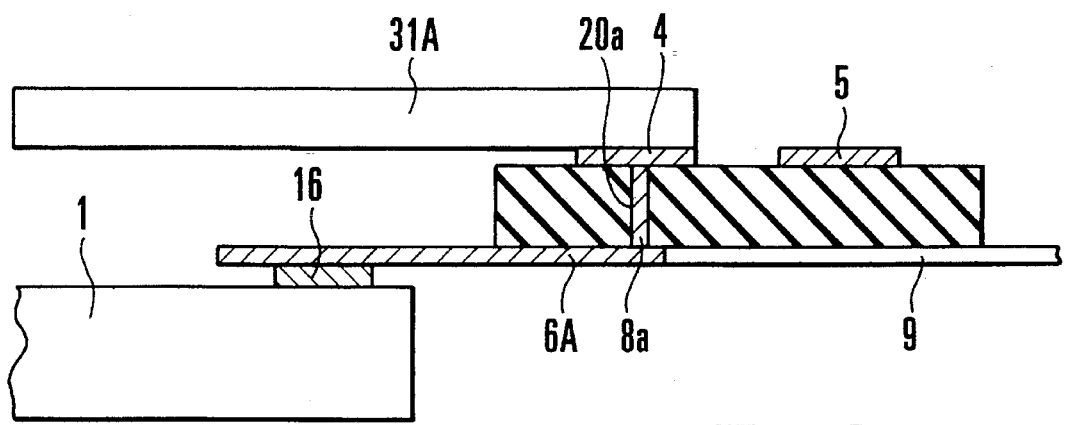
FIG. 8 is a sectional view showing the sixth embodiment of the TAB tape according to the present invention.

FIG. 8 is a sectional view showing the sixth embodiment of the present invention, in which another example of radiation of heat from individual leads of a TAB tape is illustrated.

In this embodiment, a radiating plate 31A is not in contact with a chip 1. Therefore, a principal function of the radiating plate 31A is to diffuse heat generated by the individual leads.

In the embodiment shown in FIG. 7 or 8, the common power supply lead 4 is connected to the radiating plate 31 or 31A. However, the same effect can be obtained by connecting the radiating plate 31 or 31A to the common ground lead 5.

According to the present invention as has been described above, power supply leads for supplying power to a chip and signal leads for exchanging signals with the chip are formed on one surface of a base material composed of a polyimide or the like, and a common power supply lead to be connected to the power supply leads is formed on the other surface of the base material. Therefore, the power supply leads to be connected to power supply electrodes and ground electrodes of the chip can be extracted as common leads, which are smaller in number than the power supply leads, from the common power supply lead. This makes it possible to decrease the number of leads to be connected to an external component such as a substrate.

In addition, a common signal lead to be connected to the signal leads is formed by a copper foil on the other surface of the base material. This can further decrease the number of leads to be connected an external component.

A power supply unit on a substrate is connected to the common power supply lead by using an electrically conductive adhesive, and a signal unit on the substrate is connected to the signal leads by bonding. Therefore, the power supply and ground lines can be connected by the shortest distance, and this improves the electrical characteristics of a circuit including the chip.

Also, since a radiating plate made of a metal is connected to the common power supply lead, heat generated by the individual leads upon high-speed operations of the chip can be diffused effectively.

Furthermore, the other end of the metal radiating plate, one end of which is connected to the common power supply lead, is connected to the surface of the chip different from its electrode surface by using an electrically and thermally conductive adhesive. This makes it possible to diffuse heat generated by the individual leads and also decrease the impedance of a circuit including the chip, thereby reducing noise derived from high-speed switching operations of the chip.

What is claimed is:

1. A TAB tape comprising:

a base material on which leads composed of a copper foil are formed and a power supply unit and a signal unit formed on a substrate are connected to a plurality of electrodes formed on a chip via said copper foil leads, wherein a plurality of power supply leads for supplying power to said chip, a plurality of ground leads for grounding, and a plurality of signal leads for exchanging signals with said chip are formed by said copper foil on one surface of said base material, and wherein a first end of each of said plurality of power supply leads, said plurality of ground leads and said plurality of signal leads is positioned for direct connection to a distinct one of said plurality of electrodes and a common power supply lead is connected to a second end, opposite said first end, of a plurality of at least two of said plurality of power supply leads and a common ground lead is connected to a second end, opposite said first end, of at least two of said plurality of ground leads are formed by said copper foil on the other surface of said base material.

2. A TAB tape according to claim 1, wherein a common signal lead to be connected to a number of said plurality of signal leads is formed by said copper foil on the other surface of said base material.

3. A TAB tape according to claim 1, wherein said power supply unit on said substrate and said common power supply lead are connected by an electrically conductive adhesive, and said signal unit on said substrate and said plurality of signal leads are connected by bonding.

4. A TAB tape according to claim 1, wherein a radiating plate consisting of a metal is connected to said common power supply lead or said common ground lead.

5. A TAB tape according to claim 4, wherein the other end of said metal radiating plate, one end of which is connected to said common power supply lead, is connected to the surface of said chip different from the electrode surface thereof by an electrically and thermally conductive adhesive.

6. The TAB tape defined in claim 1 wherein the base material comprises a polyimide film.

7. A semiconductor integrated circuit (IC) apparatus comprising:

a semiconductor IC chip having a periphery containing a plurality of electrodes;

a TAB tape comprising a base material, wherein a plurality of leads composed of a copper foil are formed on said base material and a first end of each of said plurality of leads is directly connected to a distinct one of the plurality of electrodes of said semiconductor IC chip, wherein a plurality of power supply leads for supplying power to said semiconductor IC chip, a plurality of ground leads for grounding, and a plurality of signal leads for exchanging signals between said chip and a location external to said semiconductor IC apparatus are formed by said copper foil on one surface of said base material, and a common power supply lead and a common ground lead are formed by said copper foil on the other surface of said base material outside the periphery of the chip, and further wherein said common power supply lead is coupled to at least two of said plurality of power supply leads through the base material for receiving and transferring power from a power source external to said semiconductor IC apparatus via said at least two of said plurality of power supply leads.

8. The apparatus defined in claim 7 wherein at least two of the plurality of ground leads are coupled through the base material to the common ground lead.

9. The apparatus defined in claim 7 wherein the common power supply lead is coupled to said at least two of said plurality of power supply leads via a through-hole.

10. The apparatus defined in claim 7 wherein the base material comprises a polyimide film.

11. The apparatus defined in claim 1 wherein a common signal lead is connected to a said end of at least two of said plurality of signal leads is formed by said copper foil on the other surface of said base material.

12. The apparatus defined in claim 1 wherein said power supply unit on said substrate and said common power supply lead are connected by an electrically conductive adhesive, and said signal unit on said substrate and said plurality of signal leads are connected by bonding.

13. The apparatus defined in claim 1 wherein a radiating plate comprising a metal is connected to said common power supply lead.

14. The apparatus defined in claim 1 wherein a radiating plate comprising a metal is connected to said common ground lead.

15. The apparatus defined in claim 14 wherein the other end of said metal radiating plate, one end of which is connected to said common power supply lead, is connected to a surface of said chip different from the plurality of electrodes by an electrically and thermally conductive adhesive.

16. A semiconductor integrated circuit (IC) apparatus comprising:

a semiconductor IC chip having a periphery with a plurality of electrodes;

a TAB tape comprising a base material, wherein a plurality of leads composed of a copper foil are formed on said base material and a first end of each of said plurality of leads is directly connected to one of the plurality of electrodes of said semiconductor IC chip, wherein a plurality of power supply leads for supplying power to said semiconductor IC chip, a plurality of ground leads for grounding, and a plurality of signal leads for exchanging signals between said chip and a location external to said semiconductor IC apparatus are formed by said copper foil on one surface of said base material, and a common power supply lead and a common ground lead are formed by said copper foil on the other surface of said base material outside the periphery of the chip, and wherein said common power supply lead is coupled to second end of a first number of said plurality of power supply leads through the base material for receiving and transferring power from a power source external to said semiconductor IC apparatus via said first number of power supply leads, and further wherein a second end of a second number of said plurality of ground leads are coupled through the base material to the common ground lead.

17. A semiconductor integrated circuit (IC) apparatus comprising:

a semiconductor IC chip having a periphery with a plurality of electrodes;

a TAB tape comprising a base material, wherein a plurality of leads composed of a copper foil are formed on said base material and a first end of said plurality of leads is directly connected to one of the plurality of electrodes of said semiconductor IC chip, wherein a plurality of power supply leads for supplying power to said semiconductor IC chip, a plurality of ground leads for grounding, and a plurality of signal leads for exchanging signals between said chip and a location external to said semiconductor IC apparatus are formed by said copper foil on one surface of said base material outside the periphery of the chip, and a common lead is formed by said copper foil on the other surface of said base material, and wherein said common lead is coupled to a second end of at least two of said plurality of leads on said one surface of said base material and acts as a pathway to an outer lead for said at least two of said plurality of leads on said one surface of said base material.

18. Thé TAB TAPE according to claim 1 wherein the plurality of electrodes are aligned along at least one edge of said chip.

19. The apparatus defined in claim 7 wherein the plurality of electrodes are aligned along at least one edge of said chip.

20. The apparatus defined in claim 16 wherein the plurality of electrodes are aligned along at least one edge of said chip.

21. The apparatus defined in claim 17 wherein the plurality of electrodes are aligned along at least one edge of said chip.

* * * * *